US009551739B2

(12) United States Patent
Osaki

(10) Patent No.: US 9,551,739 B2
(45) Date of Patent: Jan. 24, 2017

(54) COAXIAL CONNECTOR

(71) Applicant: MURATA MANUFACTURING CO., LTD., Kyoto-fu (JP)

(72) Inventor: Yoshihiro Osaki, Kyoto-fu (JP)

(73) Assignee: Murata Manufacturing Co., Ltd., Kyoto-Fu (JP)

( * ) Notice: Subject to any disclaimer, the term of this patent is extended or adjusted under 35 U.S.C. 154(b) by 112 days.

(21) Appl. No.: 14/582,385

(22) Filed: Dec. 24, 2014

(65) Prior Publication Data

US 2015/0108998 A1  Apr. 23, 2015

Related U.S. Application Data

(63) Continuation of application No. PCT/JP2013/066839, filed on Jun. 19, 2013.

(30) Foreign Application Priority Data

Aug. 9, 2012  (JP) .................. 2012-177208

(51) Int. Cl.
*G01R 31/04* (2006.01)
*H01R 24/46* (2011.01)
(Continued)

(52) U.S. Cl.
CPC ............... *G01R 31/04* (2013.01); *H01R 24/46* (2013.01); *H01R 24/50* (2013.01); *H01R 2103/00* (2013.01)

(58) Field of Classification Search
CPC ..... G01R 31/04; H01R 24/50; H01R 2103/00; H01R 24/04
(Continued)

(56) References Cited

U.S. PATENT DOCUMENTS 6,666,699 B2   12/2003   Uratani
8,038,450 B2   10/2011   Nakagawa
(Continued)

FOREIGN PATENT DOCUMENTS

JP   2001-338737 A   12/2001
JP   2002-042991 A   2/2002
(Continued)

OTHER PUBLICATIONS

International Search Report; PCT/JP2013/066839; Oct. 1, 2013.
Written Opinion of the International Searching Authority; PCT/JP2013/066839; Oct. 1, 2013.

*Primary Examiner* — Melissa Koval
*Assistant Examiner* — Courtney McDonnough
(74) *Attorney, Agent, or Firm* — Studebaker & Brackett PC

(57) ABSTRACT

A coaxial connector including a connector main body is formed of an upper housing and a lower housing. An outer conductor includes a circular cylinder portion surrounding the periphery of a hole of the connector main body and configured to be inserted into an outer conductor of a mating coaxial connector. A main body portion is provided on the connector main body, and a fixation portion that is extended from the main body portion so as to sandwich the connector main body along with the main body portion. A fixed terminal is anchored to the connector main body. A movable terminal includes a fixation portion anchored to the connector main body, and a plate spring that extends from the fixation portion toward the fixed terminal and overlaps with the fixation portion at tip ends of the plate spring.

6 Claims, 7 Drawing Sheets

(51) Int. Cl.
*H01R 24/50* (2011.01)
*H01R 103/00* (2006.01)

(58) Field of Classification Search
USPC .......................................................... 324/538
See application file for complete search history.

(56) References Cited

U.S. PATENT DOCUMENTS

| | | | |
|---|---|---|---|
| 8,066,516 B2 | 11/2011 | Hoshiba et al. | |
| 2010/0130028 A1* | 5/2010 | Hoshiba et al. | ....... H01R 24/44 439/63 |

FOREIGN PATENT DOCUMENTS

| | | | |
|---|---|---|---|
| JP | 2002-352924 A | 12/2002 |
| JP | 2010-009750 A | 1/2010 |
| JP | 2010-009751 A | 1/2010 |
| JP | 4442719 B2 | 1/2010 |
| JP | 2010-238523 A | 10/2010 |
| WO | 2009/157220 A1 | 12/2009 |

* cited by examiner

COAXIAL CONNECTOR

CROSS REFERENCE TO RELATED APPLICATIONS

This application claims benefit of priority to Japanese Patent Application No. 2012-177208 filed Aug. 9, 2012, and to International Patent Application No. PCT/JP2013/066839 filed Jun. 19, 2013, the entire content of which is incorporated herein by reference.

TECHNICAL FIELD

The present technical field relates to coaxial connectors, specifically, coaxial connectors used in transmission of high frequency signals.

BACKGROUND

As a conventional coaxial connector having been invented, for example, a coaxial connector disclosed in Japanese Patent No. 4442719 is well-known. FIG. 7(a) is a cross-sectional structure view of a coaxial connector 510 disclosed in Japanese Patent No. 4442719 in a state in which a mating coaxial connector is not mounted. FIG. 7(b) is a cross-sectional structure view of the coaxial connector 510 disclosed in Japanese Patent No. 4442719 in a state in which a mating coaxial connector is mounted.

The coaxial connector 510 includes, as shown in FIG. 7(a), a connector main body 512, an external terminal 514, a movable terminal 520, and a fixed terminal 522. The movable terminal 520 and the fixed terminal 522 are anchored to the connector main body 512. The movable terminal 520 makes press-contact with the fixed terminal 522 from the lower side thereof. Further, the connector main body 512 is provided with a hole 534a extending in the vertical direction. The external terminal 514 is configured of a circular cylinder portion concentric with the hole 534a.

On the coaxial connector 510 configured as described above, a mating coaxial connector is mounted, as shown in FIG. 7(b). The mating coaxial connector includes a probe 542. The probe 542 is inserted into the hole 534a and pushes down the movable terminal 520. With this, the movable terminal 520 and the fixed terminal 522 are separated from each other, and the movable terminal 520 and the probe 542 are connected with each other.

Note that in the coaxial connector 510 disclosed in Japanese Patent No. 4442719, there is a risk that the connector main body 512 is deformed. More specifically, a tip end of the movable terminal 520 is in contact with the connector main body 512. In the case where the movable terminal 520 is pressed by the probe 542, the tip end of the movable terminal 520 pushes the connector main body 512 downward. As a result, a risk arises that the connector main body 512 is bent so as to project downward.

SUMMARY

Technical Problem

Accordingly, an object of the present disclosure is to provide a coaxial connector that is capable of suppressing the connector main body of the coaxial connector from being deformed at a time of mounting a mating coaxial connector.

Solution to Problem

A coaxial connector according to an aspect of the present disclosure is a coaxial connector on which is mounted a test coaxial connector that includes a probe extending in the vertical direction and a first outer conductor having a cylinder shape and surrounding the periphery of the probe. The stated coaxial connector includes: a connector main body that has an upper surface and a bottom surface, and also has a hole formed therein through which the probe is inserted from the upper side to the lower side of the hole; a second outer conductor that has a cylinder portion surrounding the periphery of the hole and configured to be inserted into the first outer conductor, an outer conductor main portion provided on the above-mentioned upper surface, and an outer conductor fixation portion which is extended from the outer conductor main portion to the bottom surface so as to sandwich the connector main body along with the outer conductor main portion; a fixed terminal which is anchored to the connector main body; and a movable terminal which has a movable terminal fixation portion that is anchored to the connector main body, and a plate spring that extends from the movable terminal fixation portion toward the fixed terminal, makes contact with the fixed terminal, and overlaps with the outer conductor fixation portion at a tip end of the plate spring when viewed from below. Further, the plate spring is displaced downward by the probe so as to be separated from the fixed terminal.

Advantageous Effects of Disclosure

According to the present disclosure, the connector main body is suppressed from being deformed at the time of mounting a mating coaxial connector.

DETAILED DESCRIPTION

Hereinafter, a coaxial connector according to an embodiment of the present disclosure will be described with reference to the drawings.

Configuration of Coaxial Connector

Figure 1A:
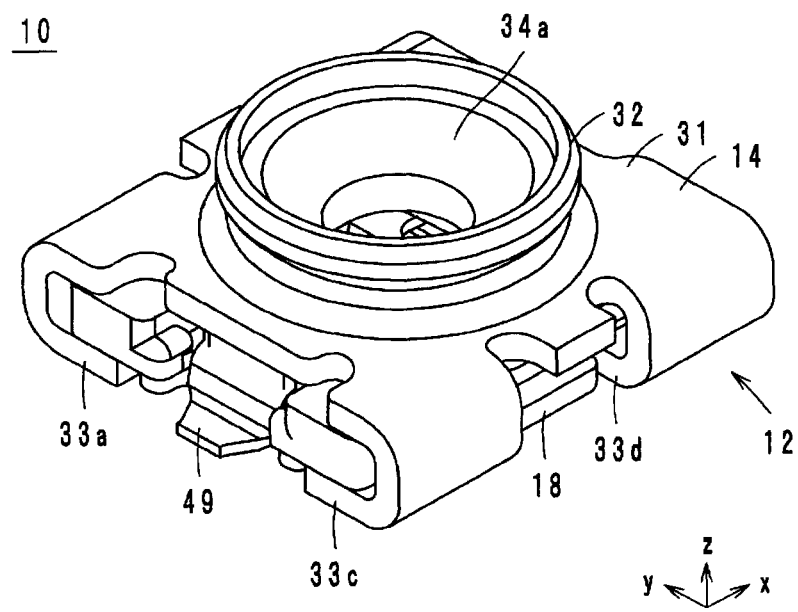
FIG. 1(a) is an exterior perspective view of a coaxial connector according to an embodiment of the present disclosure.
Figure 1B:
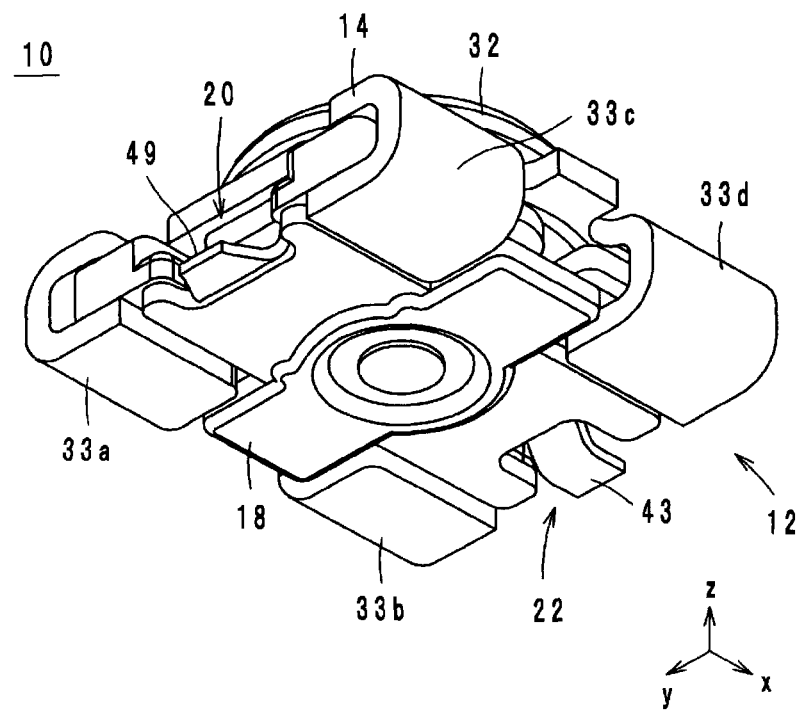
FIG. 1(b) is also an exterior perspective view of a coaxial connector according to an embodiment of the present disclosure.
Figure 2:
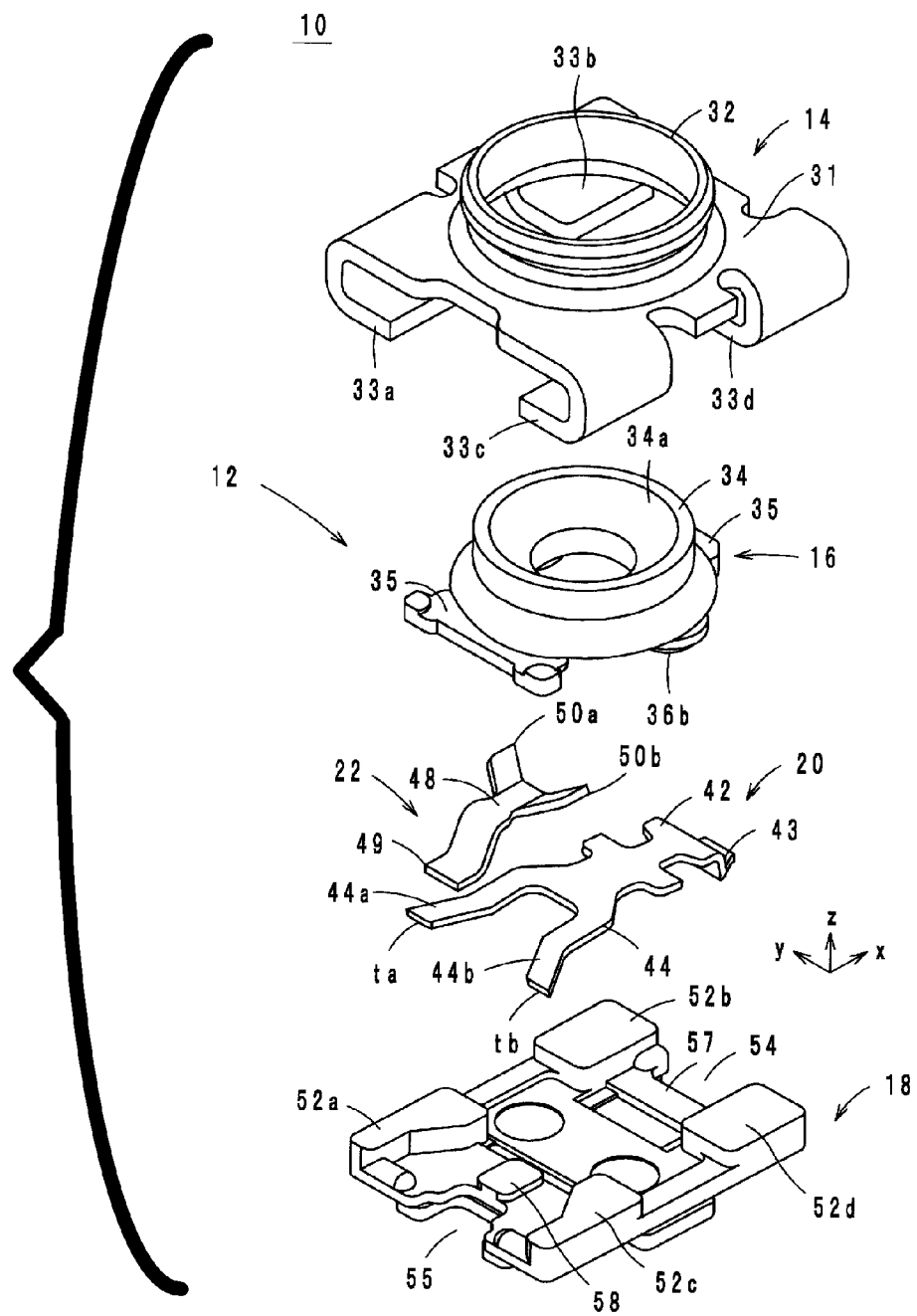
FIG. 2 is an exploded perspective view of a coaxial connector.
Figure 3:
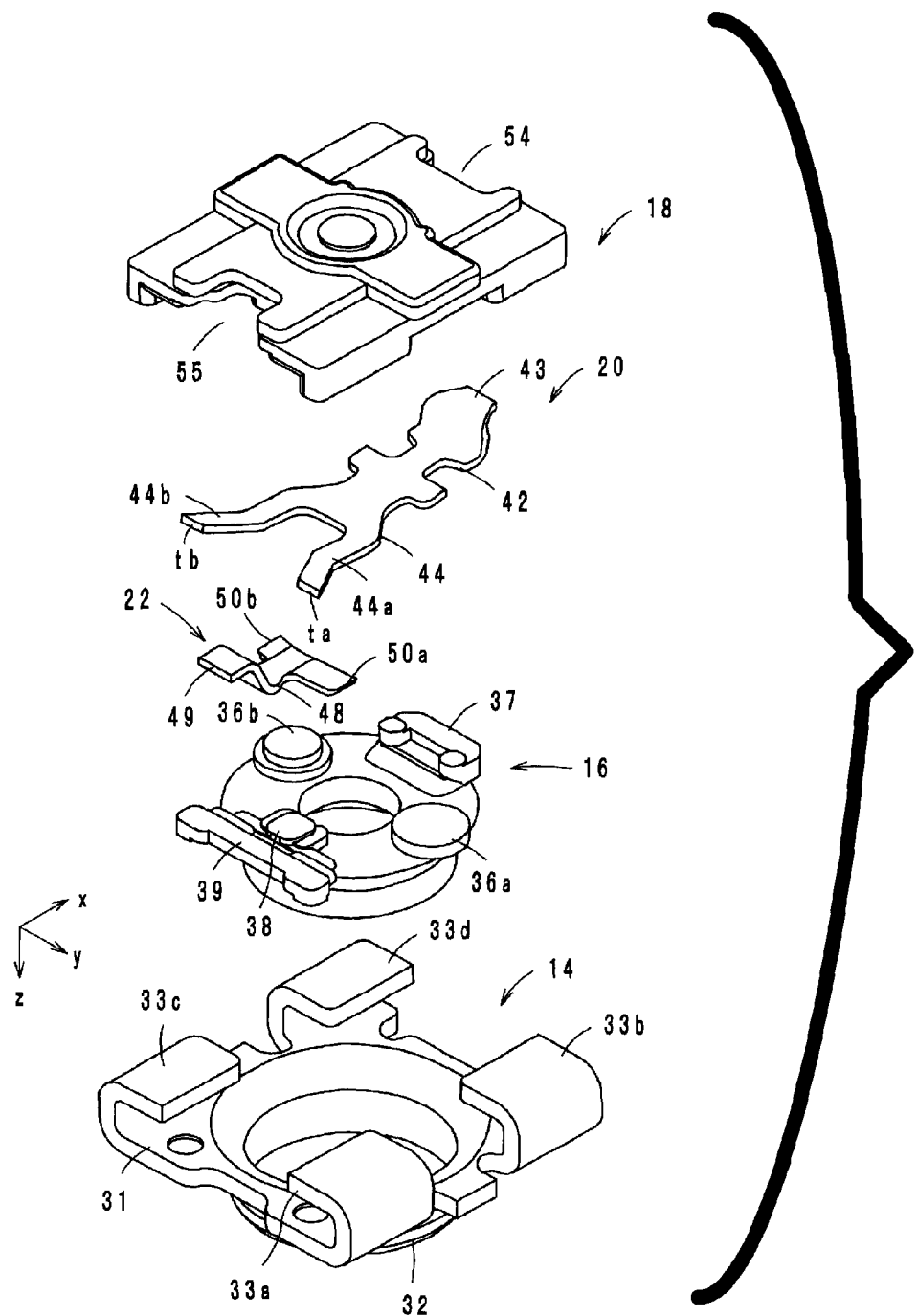
FIG. 3 is also an exploded perspective view of a coaxial connector.

A configuration of a coaxial connector according to an embodiment of the present disclosure will be described with reference to the drawings. FIG. 1(a) is an exterior perspective view of a coaxial connector 10 according to an embodiment of the present disclosure. FIG. 1(b) is also an exterior perspective view of the coaxial connector 10 according to the embodiment of the present disclosure. FIG. 2 and FIG. 3 are exploded perspective views of the coaxial connector 10. Hereinafter, details of the coaxial connector 10 will be given. Assume that in FIGS. 1(a) through 3, a direction in which an outer conductor 14, an upper housing 16, and a lower housing 18 are stacked is taken as a z-axis direction. A positive direction of the z-axis direction is a direction that extends from the lower housing 18 toward the outer conductor 14. Further, a direction in which a movable terminal 20 and a fixed terminal 22 are arranged is taken as an x-axis direction, and a direction orthogonal to both the x-axis direction and the z-axis is taken as a y-axis direction. A positive direction of the x-axis direction is a direction that extends from the fixed terminal 22 toward the movable terminal 20.

As shown in FIGS. 1(a) and 1(b), the coaxial connector 10 includes a connector main body 12, the outer conductor 14, and the movable terminal 20 and the fixed terminal 22 that are made of metal (for example, SUS301 stainless steel), and has a size of 1.6 mm×1.6 mm×0.7 mm. As shown in FIG. 2, the connector main body 12 has a configuration in which the upper housing 16 and the lower housing 18 made of resin are stacked in that order in the z-axis direction from the positive direction side toward the negative direction side.

The lower housing 18 is, as shown in FIG. 2, formed in a rectangle shape and includes projections 52a through 52d on a surface thereof on the positive direction side of the z-axis direction for positioning the upper housing 16. The projections 52a through 52d project in four corners of the rectangular lower housing 18, respectively, toward the positive direction side of the z-axis direction. The projection 52a is provided in a corner on the negative direction side of the x-axis direction and the positive direction side of the y-axis direction in the lower housing 18. The projection 52b is provided in a corner on the positive direction side of the x-axis direction and the positive direction side of the y-axis direction in the lower housing 18. The projection 52c is provided in a corner on the negative direction side of the x-axis direction and the negative direction side of the y-axis direction in the lower housing 18. The projection 52d is provided in a corner on the positive direction side of the x-axis direction and the negative direction side of the y-axis direction in the lower housing 18.

Further, as shown in FIG. 2, a rectangular cutout 54 is formed at a central portion of a side of the lower housing 18 on the positive direction side of the x-axis direction. The movable terminal 20 is extended to the exterior through this cutout 54. A fixation surface 57 configured to anchor the movable terminal 20 is provided in the vicinity of the cutout 54 on the negative direction side of the x-axis direction.

In addition, as shown in FIG. 2, a rectangular cutout is formed at a central portion of a side of the lower housing 18 on the negative direction side of the x-axis direction. The fixed terminal 22 is extended to the exterior through this cutout 55. A fixation surface 58 configured to anchor the fixed terminal 22 is provided in the vicinity of the cutout 55 on the positive direction side of the x-axis direction.

The upper housing 16 includes, as shown in FIG. 2, a circular cylinder portion 34 and a cover portion 35. The cover portion 35 is, when viewed from above in the z-axis direction, a plate material with an outer shape formed along a region surrounded by the projections 52a though 52d, and is fitted into a space among the projections 52a through 52d. The circular cylinder portion 34 projects toward the positive direction side of the z-axis direction at the center of the cover portion 35. The circular cylinder portion 34 is mortar-shaped and is open on the positive direction side of the z-axis direction, and has a hole 34a whose cross section is circular in an x-y plane. The hole 34a penetrates through the upper housing 16. A probe of the mating coaxial connector is inserted into the hole 34a from the positive direction side of the z-axis direction.

Further, ribs 36a, 36b formed in a column shape are provided projecting toward the negative direction side of the z-axis direction in a surface of the upper housing 16 on the negative direction side of the z-axis direction, as shown in FIG. 3. The rib 36a positions the upper housing 16 and the lower housing 18 by being sandwiched between the projections 52a and 52b provided in the lower housing 18. Likewise, the rib 36b positions the upper housing 16 and the lower housing 18 by being sandwiched between the projections 52c and 52d provided in the lower housing 18.

Moreover, as shown in FIG. 3, a fixation surface 37 configured to anchor the movable terminal 20 is provided, in a surface of the upper housing 16 on the negative direction side of the z-axis direction, in the vicinity of an edge on the positive direction side of the x-axis direction. The fixation surface 37 sandwiches the movable terminal 20 along with the fixation surface 57 so as to anchor the movable terminal 20 when the coaxial connector 10 is assembled. Likewise, a fixation surface 39 configured to anchor the fixed terminal 22 is provided, in the surface of the upper housing 16 on the negative direction side of the z-axis direction, in the vicinity of an edge on the negative direction side of the x-axis direction. The fixation surface 39 sandwiches the fixed terminal 22 along with the fixation surface 58 so as to anchor the fixed terminal 22 when the coaxial connector 10 is assembled. In addition, a placement portion 38 is provided at a position on the positive direction side of the x-axis direction relative to the fixation surface 39. The placement portion 38 is provided in the surface of the upper housing 16 on the negative direction side of the z-axis direction so as to project toward the negative direction side of the z-axis direction, and a fixation portion 48 and contact portions 50a, 50b of the fixed terminal 22, which will be explained later, are placed on the placement portion 38.

Here, in a state in which the upper housing 16 and the lower housing 18 are attached together, a surface formed by the surface of the projections 52a through 52d on the positive direction side of the z-axis direction and the surface of the cover portion 35 on the positive direction side of the z-axis direction will be referred to as an "upper surface" of the connector main body 12. Meanwhile, a surface of the lower housing 18 on the negative direction side of the z-axis direction will be referred to as a "bottom surface" of the connector main body 12.

Figure 4:
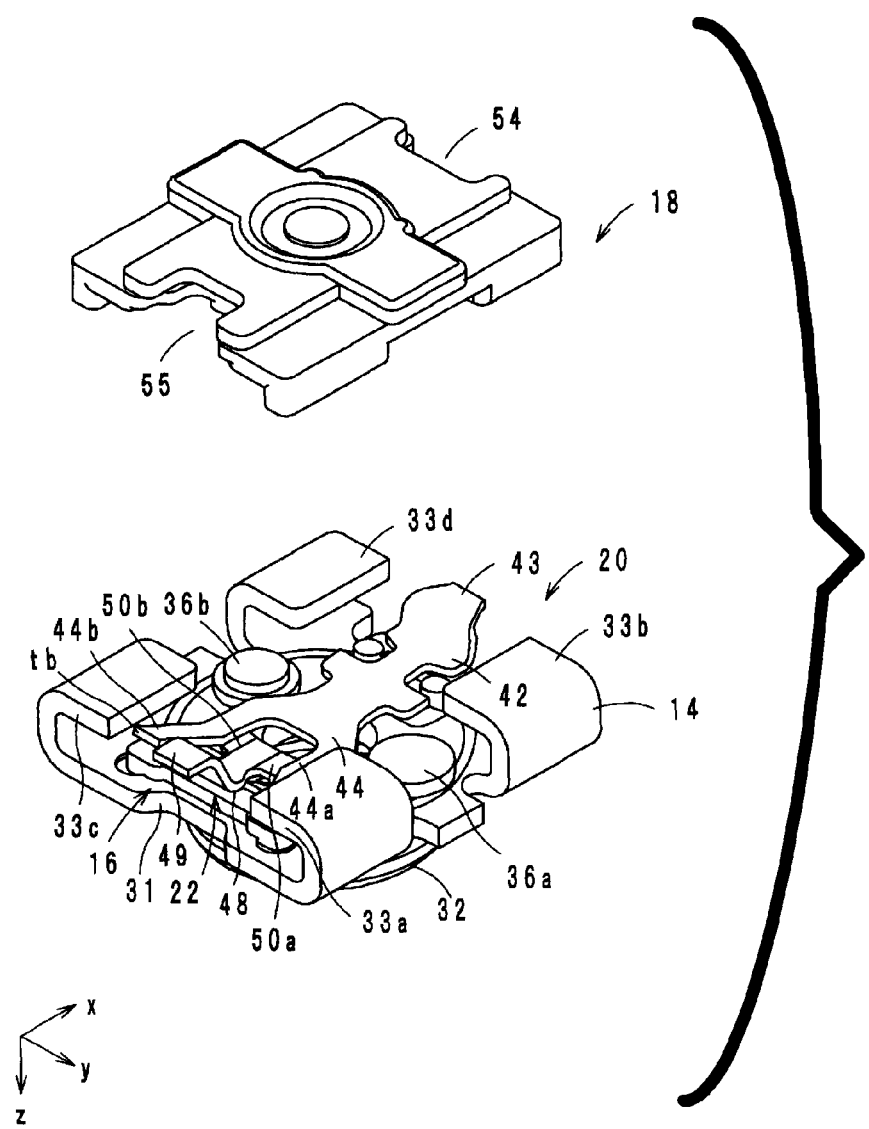
FIG. 4 is an exploded perspective view of a coaxial connector in a state in which a movable terminal and a fixed terminal are attached on an upper housing.
Figure 5:
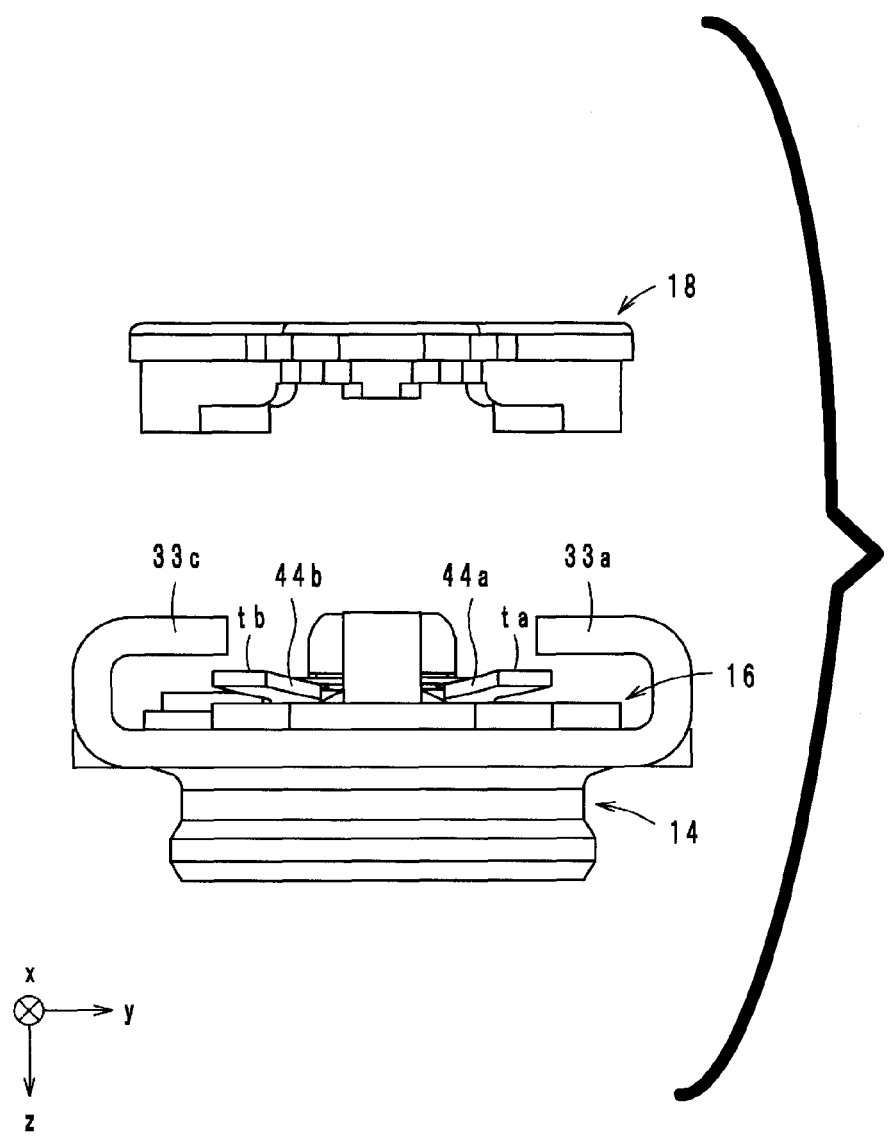
FIG. 5 is a planar view of the coaxial connector illustrated in FIG. 4 when viewed from a negative direction side of an x-axis direction.

Next, the movable terminal 20 and the fixed terminal 22 will be described with reference to FIGS. 1(a) through 5. FIG. 4 is an exploded perspective view of the coaxial connector 10 in a state in which the movable terminal 20 and the fixed terminal 22 are attached on the upper housing 16. FIG. 5 is a planar view of the coaxial connector 10 illustrated in FIG. 4 when viewed from the negative direction side of the x-axis direction.

The fixed terminal 22 is formed by performing punching and bending processes on a flat metal plate, and is configured of the fixation portion 48, a lead portion 49, and the contact portions 50a, 50b, as shown in FIGS. 2 and 3. The fixation portion 48 is a flattened portion that is anchored to the connector main body 12 by being sandwiched between the fixation surface 39 and the fixation surface 58 when the coaxial connector is assembled. The lead portion 49 is formed in an L shape through a bending process and is connected to the fixation portion 48. The lead portion 49 is exposed to the exterior of the connector main body 12 from the cutout 55, as shown in FIGS. 1(a), 1(b) and FIG. 4, when the coaxial connector 10 is assembled. As shown in FIGS. 2 through 4, the contact portions 50a and 50b are formed by being bent toward the positive direction side of the z-axis direction relative to the fixation portion 48, and each part of the contact portions 50a, 50b facing to the negative direction side of the z-axis direction makes contact with the movable terminal 20. Two contact portions, that is, the contact portions 50a and 50b are so provided as to correspond to branches 44a and 44b, which will be explained later. Bend lines between the fixation portion 48 and the contact portions 50a, 50b are parallel to the x-axis direction. The fixation portion 48, between the contact portions 50a, 50b, as well as the contact portions 50a, 50b are placed on the placement portion 38, as shown in FIGS. 3 and 4.

A metal plate having spring characteristics is punched in a predetermined shape and then is bent so as to obtain the movable terminal 20. The movable terminal 20 includes a fixation portion 42, a lead portion 43, and a plate spring 44, as shown in FIGS. 2 and 3. The fixation portion 42 is a flattened portion that is anchored to the connector main body 12 by being sandwiched between the fixation surface 37 and the fixation surface 57 when the coaxial connector is assembled. The lead portion 43 is formed in an L shape through a bending process and is connected to the fixation portion 42. The lead portion 43 is exposed to the exterior of the connector main body 12 through the cutout 54, as shown in FIGS. 1(a), 1(b), and FIG. 4, when the coaxial connector 10 is assembled.

The plate spring 44 linearly extends, as shown in FIG. 4, from the fixation portion 42 toward the fixed terminal 22 in the x-axis direction, and makes contact with the contact portions 50a and 50b of the fixed terminal 22; further, tip ends ta and tb of the plate spring 44 make contact with the lower housing 18 in a slidable manner. To be more specific, the plate spring 44 includes the branches 44a and 44b that are formed branching to two sections on the side of the tip ends ta and tb (on the negative direction side of the x-axis direction). The fixed terminal 22 is located between the branches 44a and 44b. Each of the contact portions 50a and 50b of the fixed terminal 22 further expands in the y-axis direction as it progresses toward the positive direction side of the z-axis direction so as to overlap with the branches 44a and 44b when viewed from above in the z-axis direction. The plate spring 44 is curved so as to project toward the positive direction side of the z-axis direction. With this, the branches 44a and 44b make press-contact with the contact portions 50a and 50b, respectively, with a biasing force of the plate spring 44. This makes the movable terminal 20 and the fixed terminal 22 electrically connected with each other.

Of the movable terminal 20 and the fixed terminal 22 configured in the manner described above, the fixed terminal 22 is first attached to the upper housing 16, as shown in FIG. 4. Thereafter, the movable terminal 20 is attached to the upper housing 16. Through this, each part of the branches 44a and 44b on the positive direction side of the z-axis direction makes contact with each part of the contact portions 50a and 50b on the negative direction side of the z-axis direction.

The outer conductor 14, which makes contact with an outer conductor of the mating coaxial connector, is formed through performing punching, bending, and drawing processes on a metal plate of stainless steel (for example, SUS301), and includes a main body portion 31, a circular cylinder portion 32, and fixation portions 33a through 33d, as shown in FIGS. 1(a), 1(b), and FIG. 2.

The main body portion 31 is a plate material and is provided on the upper surface of the connector main body 12. The fixation portions 33a and 33b are provided at a side of the main body portion 31 on the positive direction side of the y-axis direction. Of the plate material at a side of the main body portion 31 on the positive direction side of the y-axis direction, the plate material extending from an end portion on the negative direction side of the x-axis direction toward the positive direction side of the y-axis direction is bent so as to form the fixation portion 33a. Of the plate material at the side of the main body portion 31 on the positive direction side of the y-axis direction, the plate material extending from an end portion on the positive direction side of the x-axis direction toward the positive direction side of the y-axis direction is bent so as to form the fixation portion 33b. As described above, the fixation portions 33a and 33b are extended, as shown in FIGS. 1(a) and 1(b), from the main body portion 31 to the bottom surface of the connector main body 12, and sandwich the connector main body 12 along with the main body portion 31.

The fixation portions 33c and 33d are provided at a side of the main body portion 31 on the negative direction side of the y-axis direction. Of the plate material at a side of the main body portion 31 on the negative direction side of the y-axis direction, the plate material extending from an end portion on the negative direction side of the x-axis direction toward the negative direction side of the y-axis direction is bent so as to form the fixation portion 33c. Of the plate material at the side of the main body portion 31 on the negative direction side of the y-axis direction, the plate material extending from an end portion on the positive direction side of the x-axis direction toward the negative direction side of the y-axis direction is bent so as to form the fixation portion 33d. As described above, the fixation portions 33c and 33d are extended, as shown in FIGS. 1(a) and 1(b), from the main body portion 31 to the bottom surface of the connector main body 12, and sandwich the connector main body 12 along with the main body portion 31.

Further, the circular cylinder portion 32 projecting toward the positive direction side of the z-axis direction is provided at a central portion of the main body portion 31. The circular cylinder portion 32 is so formed as to be concentric with the circular cylinder portion 34, and surrounds the periphery of the hole 34a. The circular cylinder portion 32 is inserted into an outer conductor of the mating coaxial connector so as to be fitted into the outer conductor. The outer conductor 14 generally functions as the ground, and an outer surface of the outer conductor 14 is plated as needed.

The coaxial connector 10 configured as described above has a configuration that suppresses the connector main body 12 from being deformed in the manner as follows. More specifically, as shown in FIGS. 4 and 5, the tip ends ta and tb of the plate spring 44 overlap with the fixation portions 33a and 33c when viewed from the negative direction side of the z-axis direction. In the present embodiment, the tip ends ta and tb of the two branches 44a and 44b of the plate spring overlap with the fixation portions 33a and 33c, respectively, when viewed from the negative direction side of the z-axis direction. Therefore, in order for the fixation portions 33a through 33d to overlap with the tip ends ta and tb of the two branches 44a and 44b, at least no less than two fixation portions are provided (four in the present embodiment). Furthermore, as shown in FIG. 5, the tip ends ta and tb extend in the y-axis direction, and tip ends of the fixation portions 33a and 33c extend in the x-axis direction. Then, the tip ends ta and tb intersect with the tip ends of the fixation portions 33a and 33c, respectively. In other words, the tip ends ta and tb partially overlap with the fixation portions 33a and 33c.

The coaxial connector 10 configured in the manner described above is assembled as follows. That is, as shown in FIG. 4, the fixed terminal 22 is positioned and attached to the upper housing 16, thereafter the movable terminal 20 is positioned and attached to the upper housing 16. Although the fixation portions 33a through 33d are bent in FIG. 4, the fixation portions 33a through 33d have not been bent in reality at this stage.

Next, as shown in FIG. 4, the outer conductor 14 is attached to the upper housing 16 from the positive direction side of the z-axis direction. At this time, the circular cylinder portion 34 is inserted into the circular cylinder portion 32. Thereafter, as shown in FIG. 3, the lower housing 18 is mounted in a stacked manner on the upper housing 16 from the negative direction side of the z-axis direction.

Finally, by crimping the fixation portions 33a through 33d of the outer conductor 14, the coaxial connector 10 having the configuration as shown in FIGS. 1(a) and 1(b) can be obtained.

Figure 6A:
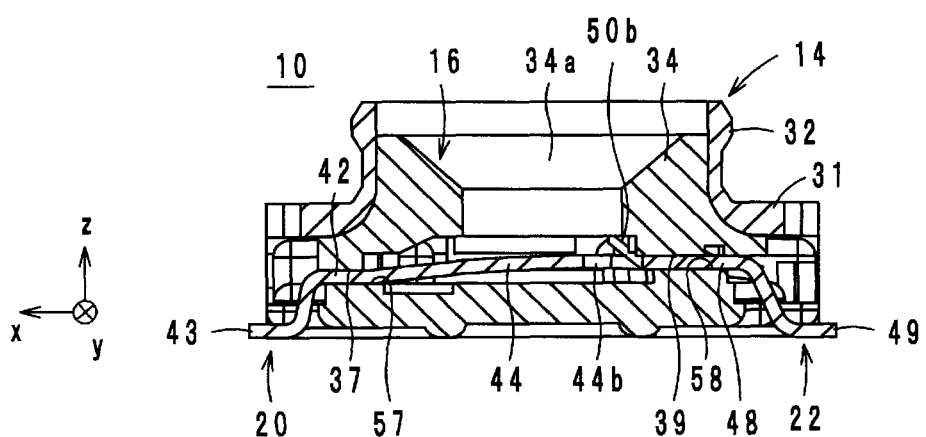
FIG. 6(a) is a cross-sectional structure view of a coaxial connector in an x-z plane when a mating coaxial connector is not mounted therein.
Figure 6B:
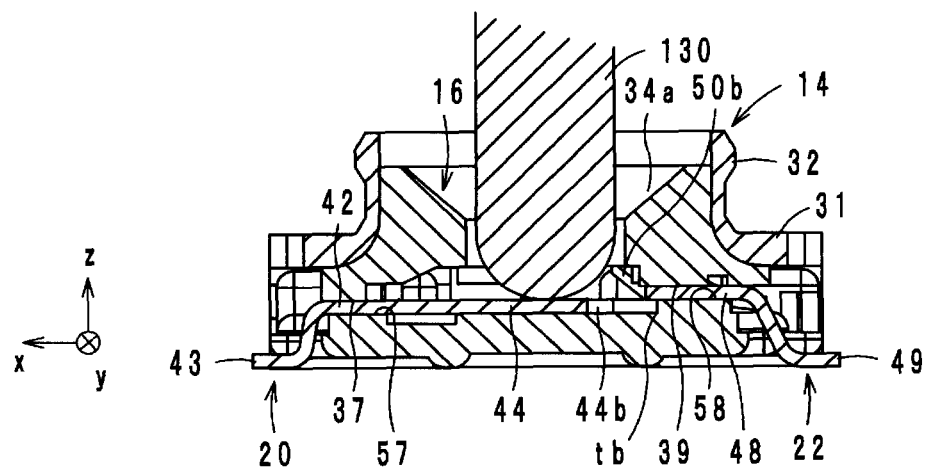
FIG. 6(b) is a cross-sectional structure view of a coaxial connector in the x-z plane when a mating coaxial connector is mounted therein.
Figure 7A:
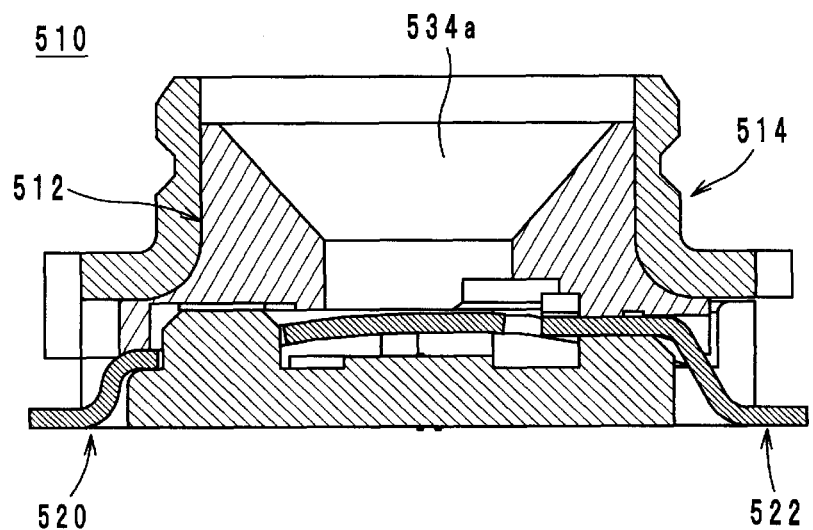
FIG. 7(a) is a cross-sectional structure view of the coaxial connector disclosed in Japanese Patent No. 4442719 in a state where a mating coaxial connector is not mounted.
Figure 7B:
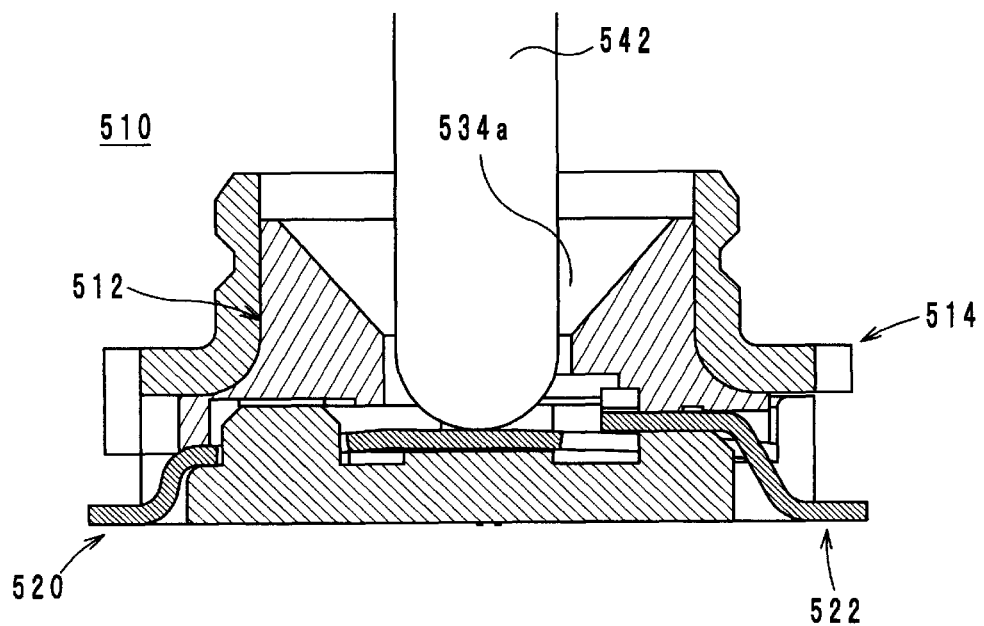
FIG. 7(b) is a cross-sectional structure view of the coaxial connector disclosed in Japanese Patent No. 4442719 in a state where a mating coaxial connector is mounted therein.

Next, operation of the coaxial connector 10 will be described with reference to FIGS. 6(a) and 6(b). FIG. 6(a) is a cross-sectional structure view of the coaxial connector 10 in an x-z plane when a mating coaxial connector is not mounted. FIG. 6(b) is a cross-sectional structure view of the coaxial connector 10 in the x-z plane when a mating coaxial connector is mounted.

The mating coaxial connector includes a probe 130 and an outer conductor (not shown). The probe 130 is a bar-shaped metal terminal extending in the z-axis direction. The outer conductor is a cylinder-shaped conductor surrounding the periphery of the probe 130.

As shown in FIG. 6(a), in the case where the mating coaxial connector is not mounted, the movable terminal 20 is in a state in which a central portion of the movable terminal in the x-axis direction is expanded toward the positive direction side of the z-axis direction. With this, the branches 44a and 44b (only the branch 44b is illustrated in FIGS. 6(a) and 6(b)) make press-contact with the contact portions 50a and 50b (only the contact portion 50b is illustrated in FIGS. 6(a) and 6(b)) with a biasing force of the plate spring 44, and the movable terminal 20 and the fixed terminal 22 are electrically connected with each other.

Meanwhile, in the case where the mating coaxial connector is mounted, the probe 130 of the mating coaxial connector is inserted into the hole 34a from the positive direction side toward the negative direction side of the z-axis direction. Through this, the probe 130 makes contact with the plate spring 44 and pushes down the plate spring 44 toward the negative direction side of the z-axis direction. In other words, the plate spring 44 is displaced toward the negative direction side of the z-axis direction by the probe 130 so as to be separated from the fixed terminal 22. With this, as shown in FIG. 6(b), the branches 44a and 44b of the plate spring 44 are separated from the contact portions 50a and 50b, the movable terminal 20 and the fixed terminal 22 are electrically cut off from each other, and the probe 130 is electrically connected with the movable terminal 20. At the same time, the outer conductor of the mating coaxial connector (not illustrated) is fitted onto the outer conductor 14 so that the outer conductor is electrically connected with the outer conductor 14 as well.

In the case where the mating coaxial connector is detached from the coaxial connector 10, the central portion of the plate spring 44 in the x-axis direction returns toward the positive direction side of the z-axis direction as shown in FIG. 6(a). Due to this, the movable terminal 20 and the fixed terminal 22 are electrically connected with each other again, whereas the probe 130 and the movable terminal 20 are electrically cut off from each other.

Effects

According to the coaxial connector 10 configured in the manner described above, the connector main body 12 is suppressed from being deformed. To be more specific, in the coaxial connector 10, the tip ends to and tb of the plate spring 44 overlap with the fixation portions 33a and 33c when viewed from the negative direction side of the z-axis direction, as illustrated in FIGS. 4 and 5. In other words, the connector main body 12 is supported by the fixation portions 33a and 33c from the negative direction side of the z-axis direction at the positions where the tip ends ta and tb make contact with the connector main body 12. With this, even if the tip ends ta and tb push the connector main body 12 toward the negative direction side of the z-axis direction as the plate spring 44 is pushed toward the negative direction side of the z-axis direction by the probe 130, the fixation portions 33a and 33c suppress the connector main body 12 from being deformed. Further, suppressing the deformation of the connector main body 12 makes it possible to use a thinner connector main body 12. As a result, a height of the coaxial connector 10 is lowered.

It is preferable for the fixation portions 33a and 33c to overlap with the tip ends ta and tb in a state in which the plate spring 44 is pushed by the probe 130 (state of FIG. 6(b)) and a state in which the plate spring 44 is not pushed by the probe 130 (state of FIG. 6(a)). However, it is sufficient that the fixation portions 33a and 33c overlap with the tip ends ta and tb at least in a state of the plate spring 44 being pushed by the probe 130.

Further, according to the coaxial connector 10, the deformation of the connector main body 12 is suppressed because of the following reasons as well. That is, in the coaxial connector 510 disclosed in Japanese Patent No. 4442719, the tip end of the movable terminal 520 is in contact with the connector main body 512 even in a state of the movable terminal 520 not being pushed by the probe 542. Due to this, the connector main body 512 is applied a force from the movable terminal 520 toward the negative direction side of the z-axis direction even in a case of the movable terminal 520 not being pushed by the probe 542. In this case, if the connector main body 512 is heated in a reflow process when the coaxial connector 510 is mounted on a circuit board, there arises a risk that the connector main body 512, which is made of resin, is softened and curved so as to project toward the negative direction side of the z-axis direction. As a result, the bottom surface of the connector main body 512 becomes uneven, which raises a risk of occurrence of a mounting failure of the coaxial connector 510.

Therefore, in the coaxial connector 10, as shown in FIGS. 4 and 5, the tip ends ta and tb of the plate spring 44 overlap with the fixation portions 33a and 33c when viewed from the negative direction side of the z-axis direction. In other words, the connector main body 12 is supported by the fixation portions 33a and 33c from the negative direction side of the z-axis direction at the position where the tip ends ta and tb make contact with connector main body 12. This suppresses the connector main body 12 from being deformed in the reflow process. In order to suppress the deformation of the connector main body 12 in the reflow process, it is necessary for the fixation portions 33a and 33c to overlap with the tip ends ta and tb in a state in which the plate spring 44 is not pushed by the probe 130.

Variations

The coaxial connector 10 is not intended to be limited to the above embodiment, and can be varied without departing from the spirit and scope of the disclosure. For example, the plate spring 44 may not branch to the branches 44a and 44b. In other words, the plate spring 44 may be a single bar-like member extending in the x-axis direction.

The tip ends ta and tb of the plate spring 44 may not be in contact with the connector main body 12 in a state of the plate spring 44 not being pushed by the probe 130. In other words, the tip ends ta and tb of the plate spring 44 may make contact with the connector main body 12 by the plate spring 44 being pushed by the probe 130.

INDUSTRIAL APPLICABILITY

As described thus far, the present disclosure is useful in use for coaxial connectors, and is particularly excellent in that the deformation of a connector main body can be suppressed.

The invention claimed is:

1. A coaxial connector on which is mounted a test coaxial connector that includes a probe extending in a vertical direction and a first outer conductor having a cylinder shape and surrounding a periphery of the probe, the coaxial connector comprising:
   a connector main body including an upper surface and a bottom surface, and a hole formed in the connector main body through which the probe is inserted from an upper side to a lower side of the hole;
   a second outer conductor including a cylinder portion surrounding a periphery of the hole and configured to be inserted into the first outer conductor, an outer conductor main portion provided on the upper surface, and an outer conductor fixation portion which is extended from the outer conductor main portion to the bottom surface so as to sandwich the connector main body along with the outer conductor main portion;
   a fixed terminal anchored to the connector main body; and
   a movable terminal including a movable terminal fixation portion anchored to the connector main body, and a plate spring extending from the movable terminal fixation portion toward the fixed terminal, making contact with the fixed terminal, and overlapping with the outer conductor fixation portion at a tip end of the plate spring when viewed from bottom,
   wherein the plate spring is displaced downward by the probe so as to be separated from the fixed terminal.

2. The coaxial connector according to claim 1, wherein the plate spring makes contact with the connector main body at the tip end of the plate spring.

3. The coaxial connector according to claim 1, wherein the fixed terminal includes:
   a fixed terminal fixation portion anchored to the connector main body; and
   a contact portion that is formed by being bent upward relative to the fixed terminal fixation portion, and that makes contact with the plate spring at a part where the contact portion is bent downward.

4. The coaxial connector according to claim 1, wherein the plate spring includes two branches that are formed branching to two sections at the tip end side of the plate spring,
   the fixed terminal is located between the two branches, and
   at least no less than two outer conductor fixation portions are provided so as to overlap with tip ends of the two branches.

5. The coaxial connector according to claim 4, wherein there are provided two contact portions so as to correspond to the two branches, respectively.

6. The coaxial connector according to claim 1, wherein the plate spring is curved so as to project upward.

* * * * *